United States Patent
Wang et al.

(10) Patent No.: US 10,714,639 B2
(45) Date of Patent: Jul. 14, 2020

(54) SILICON-GERMANIUM PHOTOELECTRIC DETECTION APPARATUS BASED ON ON-CHIP MODE CONVERTER

(71) Applicant: WUHAN RESEARCH INSTITUTE OF POSTS AND TELECOMMUNICATIONS, Wuhan, Hubei (CN)

(72) Inventors: Lei Wang, Hubei (CN); Xi Xiao, Hubei (CN); Daigao Chen, Hubei (CN); Miaofeng Li, Hubei (CN); Ying Qiu, Hubei (CN)

(73) Assignee: WUHAN RESEARCH INSTITUTE OF POSTS AND TELECOMMUNICATIONS, Wuhan, Hubei (CN)

( * ) Notice: Subject to any disclaimer, the term of this patent is extended or adjusted under 35 U.S.C. 154(b) by 0 days.

(21) Appl. No.: 16/061,651

(22) PCT Filed: Dec. 7, 2016

(86) PCT No.: PCT/CN2016/108957
§ 371 (c)(1),
(2) Date: Jun. 12, 2018

(87) PCT Pub. No.: WO2017/101724
PCT Pub. Date: Jun. 22, 2017

(65) Prior Publication Data
US 2018/0374969 A1    Dec. 27, 2018

(30) Foreign Application Priority Data

Dec. 15, 2015    (CN) .......................... 2015 1 0937427

(51) Int. Cl.
*H01L 31/0224* (2006.01)
*H01L 31/028* (2006.01)
(Continued)

(52) U.S. Cl.
CPC .... *H01L 31/022408* (2013.01); *H01L 27/144* (2013.01); *H01L 31/028* (2013.01);
(Continued)

(58) Field of Classification Search
CPC ....... H01L 31/022408; H01L 31/02327; H01L 31/028; H01L 31/08; H01L 31/103; H01L 31/1105; H01L 31/105; H01L 31/107
See application file for complete search history.

(56) References Cited

U.S. PATENT DOCUMENTS

2014/0114187 A1* 4/2014 Rozental ................ G01H 9/004
600/437

OTHER PUBLICATIONS

WO 2017/000873 Machine Translation (Year: 2015).*
WO 2017/000873 Drawings (Year: 2015).*
WO 2017/000873 FRont Page (Year: 2015).*

* cited by examiner

*Primary Examiner* — Patricia D Reddington
(74) *Attorney, Agent, or Firm* — Houtteman Law LLC

(57) ABSTRACT

An on-chip mode converter-based silicon-germanium photoelectric detection apparatus comprises an insulating substrate, an optical coupler, an on-chip mode converter and a multi-mode silicon-germanium photoelectric detector. The optical coupler, the converter and the photoelectric detector are sequentially connected and all fixed on silicon wafers of the insulating substrate. An incident fundamental mode optical signal is transmitted to the optical coupler through a single-mode fiber, enters the converter via the optical coupled. The converter converts the fundamental mode optical signal into a multi-mode optical field and enters the photoelectric detector, which converts the multi-mode optical field into an electrical signal. Heavily germanium-doped region are located in areas with relatively weak distributed light intensity of the multi-mode optical field. The absorp-
(Continued)

tion loss of the heavily germanium-doped region and third through-holes on the optical field is dramatically reduced and the responsiveness of the apparatus can be improved effectively.

5 Claims, 2 Drawing Sheets

(51) Int. Cl.
*H01L 27/144* (2006.01)
*H01L 31/103* (2006.01)
*H01L 31/0232* (2014.01)
*H01L 31/11* (2006.01)
*H01L 31/08* (2006.01)
*H01L 31/105* (2006.01)
*H01L 31/107* (2006.01)

(52) U.S. Cl.
CPC ........ *H01L 31/02327* (2013.01); *H01L 31/08* (2013.01); *H01L 31/103* (2013.01); *H01L 31/1105* (2013.01); *H01L 31/105* (2013.01); *H01L 31/107* (2013.01)

SILICON-GERMANIUM PHOTOELECTRIC
DETECTION APPARATUS BASED ON
ON-CHIP MODE CONVERTER

TECHNICAL FIELD

The present invention relates to the field of optical communication devices, and in particular to a silicon-germanium photoelectric detection apparatus based on on-chip mode converter.

BACKGROUND ART

Photoelectric detector is a critical device in optical communication systems. Silicon-based photon technologies have witnessed their fast development in recent years. Silicon-germanium photoelectric detector that is compatible with CMOS (Complementary Metal Oxide Semiconductor) processes will be widely applied owing to their capability to be monolithically integrated with other silicon-based photonic devices. However, in addition to being absorbed by germanium to generate an electrical signal, another part of an optical field is absorbed by heavily germanium-doped region and through-holes, thereby incurring additional losses and degrading the responsiveness of silicon-germanium photoelectric detector.

SUMMARY OF THE INVENTION

It is an object of the present invention to overcome the above-described shortcomings in the background art by providing a silicon-germanium photoelectric detection apparatus based on on-chip mode converter, in which heavily germanium-doped region are located in areas with relatively weak distributed light intensity of the multi-mode optical field, the absorption loss of the heavily germanium-doped region and related through-holes on the optical field is dramatically reduced and the responsiveness of the silicon-germanium photoelectric detection apparatus can be improved effectively.

Provided in the present invention is a silicon-germanium photoelectric detection apparatus based on on-chip mode converter, which comprises an insulating substrate, an optical coupler, an on-chip mode converter and a multi-mode silicon-germanium photoelectric detector, the optical coupler, the on-chip mode converter and the multi-mode silicon-germanium photoelectric detector are sequentially connected and all fixed on silicon wafers of the insulating substrate, an incident fundamental mode optical signal is transmitted to the optical coupler through a single-mode fiber, the fundamental mode optical signal coupled via the optical coupler enters the on-chip mode converter, the on-chip mode converter converts the fundamental mode optical signal into a multi-mode optical field, the multi-mode optical field enters the multi-mode silicon-germanium photoelectric detector, which then converts the multi-mode optical field into an electrical signal.

Based on the above technical solution, the multi-mode silicon-germanium photoelectric detector comprises a silicon substrate layer, the silicon substrate layer is covered with a silicon dioxide layer over which a first heavily silicon-doped region, a lightly silicon-doped region and a second heavily silicon-doped region are distributed, the first heavily silicon-doped region and the second heavily silicon-doped region are located on both sides of the lightly silicon-doped region, respectively, a multi-mode germanium absorption waveguide is grown on the lightly silicon-doped region, at least one heavily germanium-doped region is on the interior top of the multi-mode germanium absorption waveguide, the periphery of the multi-mode germanium absorption waveguide is covered with the silicon dioxide layer, a first silicon electrode, a germanium electrode and a second silicon electrode are disposed on the silicon dioxide layer, the first silicon electrode is located immediately above the first heavily silicon-doped region, the second silicon electrode is located immediately above the second heavily silicon-doped region, the germanium electrode is located immediately above the heavily germanium-doped region, a first through-hole is formed on the silicon dioxide layer between the first silicon electrode and the first heavily silicon-doped region, at least one third through-hole is formed on the silicon dioxide layer between the germanium electrode and at least one heavily germanium-doped region, the third through-holes are in one-to-one correspondence with the heavily germanium-doped region, a second through-hole is formed on the silicon dioxide layer between the second silicon electrode and the second heavily silicon-doped region, the first through-hole, the third through-holes and the second through-hole are each internally filled with metal that functions as a conductor, the first silicon electrode accomplishes electrical connection with the first heavily silicon-doped region through the metal conductor within the first through-hole, the germanium electrode accomplishes electrical connection with the heavily germanium-doped region through the metal conductors within the third through-holes, and the second silicon electrode accomplishes electrical connection with the second heavily silicon-doped region through the metal conductor within the second through-hole.

Based on the above technical solution, the multi-mode optical field is composed of a plurality of transversely-distributed circular optical spots with each having the strongest light intensity at its center, the light intensity gradually attenuates from the center towards the periphery, and the heavily germanium-doped region are located in areas with relatively weak distributed light intensity of the multi-mode optical field.

Based on the above technical solution, the positions covered with the heavily germanium-doped region have a light intensity that is 15% smaller than the position with the strongest light intensity in the multi-mode optical field.

Based on the above technical solution, when the multi-mode optical field is in a first-order mode, there is only one heavily germanium-doped region on the interior top of the multi-mode germanium absorption waveguide, only one third through-hole is present between the germanium electrode and the heavily germanium-doped region, the optical field distribution of the multi-mode optical field is two circular optical spots, each circular optical spot has the strongest light intensity at its center, and the light intensity gradually attenuates from the center towards the periphery, the heavily germanium-doped region is located at an edge where outer contour lines of the two circular optical spots come into contact and is relatively far from the centers of the two circular optical spots, the position covered with the heavily germanium-doped region has a very weak light intensity, the absorption loss brought on the optical field by the heavily germanium-doped region and the third through-hole is dramatically reduced and the responsiveness of the silicon-germanium photoelectric detection apparatus can be improved effectively.

Based on the above technical solution, when the multi-mode optical field is in a second-order mode, there are two heavily germanium-doped region on the interior top of the multi-mode germanium absorption waveguide, two third through-holes are present between the germanium electrode and the heavily germanium-doped region, the optical field distribution of the multi-mode optical field is three circular optical spots, each circular optical spot has the strongest light intensity at its center, and the light intensity gradually attenuates from the center towards the periphery, the two heavily germanium-doped region are respectively located at edges where every two outer contour lines of the three circular optical spots come into contact and are relatively far from the centers of the three circular optical spots, the positions covered with the two heavily germanium-doped region both have a very weak light intensity, the absorption loss brought on the optical field by the two heavily germanium-doped region and the two third through-holes is dramatically reduced and the responsiveness of the silicon-germanium photoelectric detection apparatus can be improved effectively.

As compared to the prior art, the present invention has the following advantages.

The silicon-germanium photoelectric detection apparatus in the present invention comprises an insulating substrate, an optical coupler, an on-chip mode converter and a multi-mode silicon-germanium photoelectric detector, the optical coupler, the on-chip mode converter and the multi-mode silicon-germanium photoelectric detector are sequentially connected and all fixed on silicon wafers of the insulating substrate, an incident fundamental mode optical signal is transmitted to the optical coupler through a single-mode fiber, the fundamental mode optical signal coupled via the optical coupler enters the on-chip mode converter, the on-chip mode converter converts the fundamental mode optical signal into a multi-mode optical field, the multi-mode optical field enters the multi-mode silicon-germanium photoelectric detector, which then converts the multi-mode optical field into an electrical signal. In the multi-mode silicon-germanium photoelectric detector, heavily germanium-doped region are located in areas with relatively weak distributed light intensity of the multi-mode optical field, the absorption loss of the heavily germanium-doped region and third through-holes on the optical field is dramatically reduced and the responsiveness of the silicon-germanium photoelectric detection apparatus can be improved effectively.

DETAILED DESCRIPTION OF THE INVENTION

The present invention will be further described in details below in conjunction with the accompanying drawings and the specific embodiments.

Figure 1:
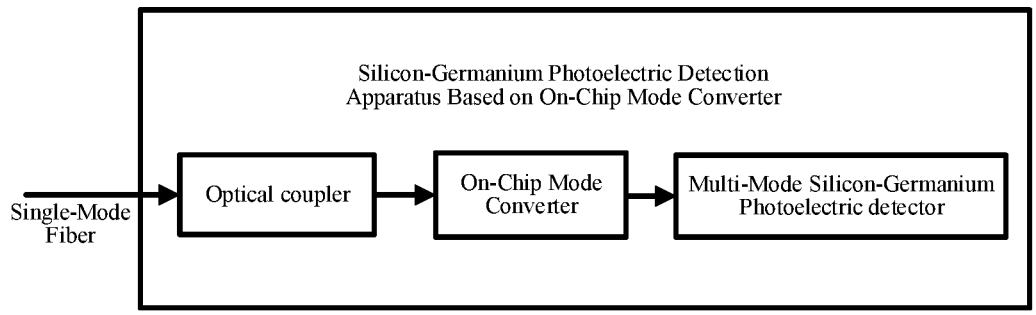
FIG. 1 is a structural block diagram of the silicon-germanium photoelectric detection apparatus based on on-chip mode converter in the embodiments of the present invention.

With reference to FIG. 1, to improve the responsiveness of silicon-germanium photoelectric detection apparatuses, it provided in the embodiments of the present invention is a silicon-germanium photoelectric detection apparatus based on on-chip mode converter. The silicon-germanium photoelectric detection apparatus comprises an insulating substrate, an optical coupler, an on-chip mode converter and a multi-mode silicon-germanium photoelectric detector. The optical coupler, the on-chip mode converter and the multi-mode silicon-germanium photoelectric detector are sequentially connected and all fixed on silicon wafers of the insulating substrate. An incident fundamental mode optical signal is transmitted to the optical coupler through a single-mode fiber, the fundamental mode optical signal coupled via the optical coupler enters the on-chip mode converter, the on-chip mode converter converts the fundamental mode optical signal into a multi-mode optical field, and the multi-mode optical field enters the multi-mode silicon-germanium photoelectric detector, which then converts the multi-mode optical field into an electrical signal.

Figure 2:
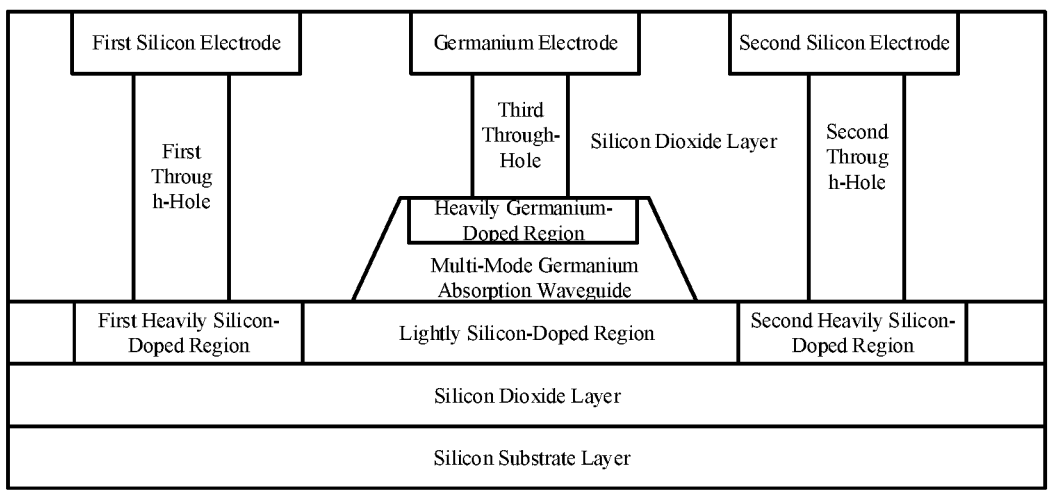
FIG. 2 is a schematic cross-sectional view of the multi-mode silicon-germanium photoelectric detector in the embodiments of the present invention.

With reference to FIG. 2, the multi-mode silicon-germanium photoelectric detector comprises a silicon substrate layer, the silicon substrate layer is covered with a silicon dioxide layer over which a first heavily silicon-doped region, a lightly silicon-doped region and a second heavily silicon-doped region are distributed, the first heavily silicon-doped region and the second heavily silicon-doped region are located on both sides of the lightly silicon-doped region, respectively, a multi-mode germanium absorption waveguide is grown on the lightly silicon-doped region, at least one heavily germanium-doped region is on the interior top of the multi-mode germanium absorption waveguide, the periphery of the multi-mode germanium absorption waveguide is covered with the silicon dioxide layer, a first silicon electrode, a germanium electrode and a second silicon electrode are disposed on the silicon dioxide layer, the first silicon electrode is located immediately above the first heavily silicon-doped region, the second silicon electrode is located immediately above the second heavily silicon-doped region, the germanium electrode is located immediately above the heavily germanium-doped region, a first through-hole is formed on the silicon dioxide layer between the first silicon electrode and the first heavily silicon-doped region, at least one third through-hole is formed on the silicon dioxide layer between the germanium electrode and at least one heavily germanium-doped region, the third through-holes are in one-to-one correspondence with the heavily germanium-doped region, a second through-hole is formed on the silicon dioxide layer between the second silicon electrode and the second heavily silicon-doped region, the first through-hole, the third through-holes and the second through-hole are each internally filled with metal that functions as a conductor, the first silicon electrode accomplishes electrical connection with the first heavily silicon-doped region through the metal conductor within the first through-hole, the germanium electrode accomplishes electrical connection with the heavily germanium-doped region through the metal conductors within the third through-holes, and the second silicon electrode accomplishes electrical connection with the second heavily silicon-doped region through the metal conductor within the second through-hole.

Figure 3:
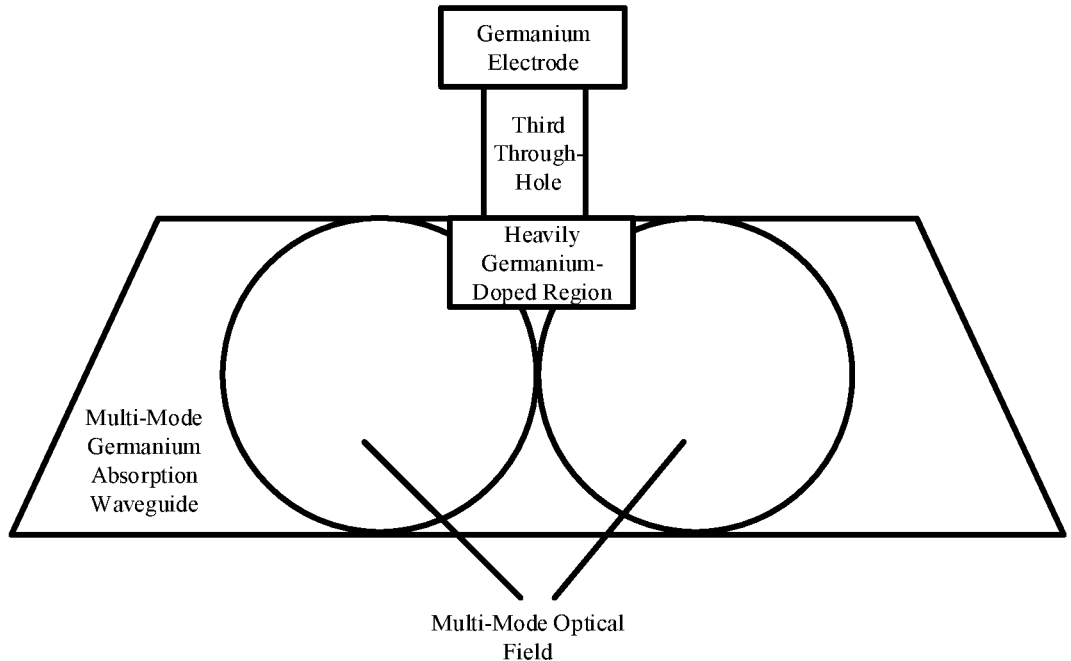
FIG. 3 is a schematic view illustrating distribution of the heavily germanium-doped region and the multi-mode optical field when the multi-mode optical field is in a first-order mode in the embodiments of the present invention.
Figure 4:
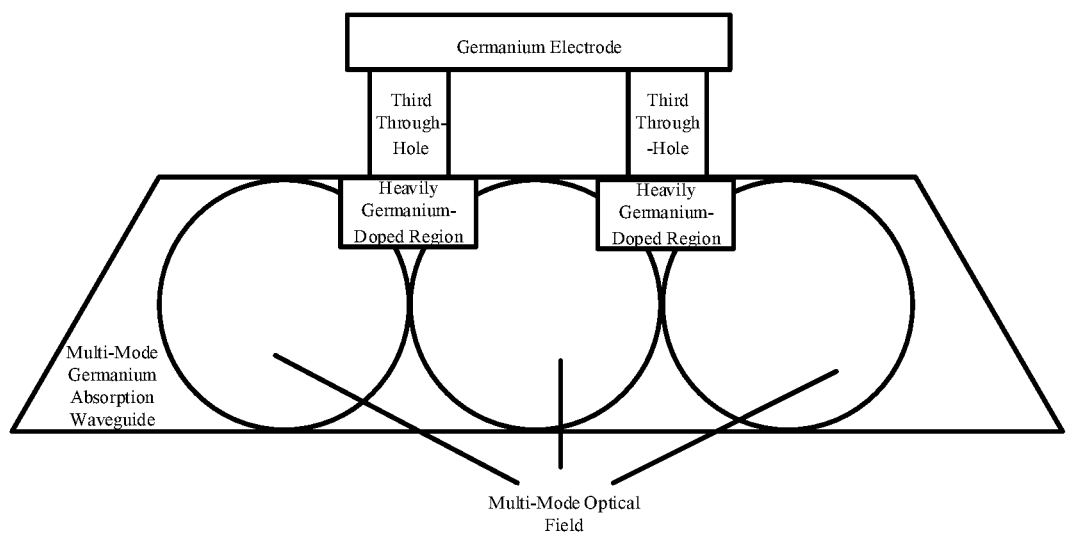
FIG. 4 is a schematic view illustrating distribution of the heavily germanium-doped region and the multi-mode optical field when the multi-mode optical field is in a second-order mode in the embodiments of the present invention.

With reference to FIG. 3 and FIG. 4, the multi-mode optical field is composed of a plurality of transversely-distributed circular optical spots with each having the strongest light intensity at its center, the light intensity gradually attenuates from the center towards the periphery, the heavily germanium-doped region are located in areas with relatively weak distributed light intensity of the multi-mode optical field, and the positions covered with the heavily germanium-doped region have a light intensity that is 15% smaller than the position with the strongest light intensity in the multi-mode optical field.

With reference to FIG. 3, when the multi-mode optical field is in a first-order mode, there is only one heavily germanium-doped region on the interior top of the multi-mode germanium absorption waveguide, only one third through-hole is present between the germanium electrode and the heavily germanium-doped region, the multi-mode optical field has an optical field distribution of two circular optical spots, each circular optical spot has the strongest light intensity at its center, and the light intensity gradually attenuates from the center towards the periphery, the heavily germanium-doped region is located at an edge where outer contour lines of the two circular optical spots come into contact and is relatively far from the centers of the two circular optical spots, the position covered with the heavily germanium-doped region has a very weak light intensity, as a result, the absorption loss brought on the optical field by the heavily germanium-doped region and the third through-hole is dramatically reduced and the responsiveness of the silicon-germanium photoelectric detection apparatus can be improved effectively.

With reference to FIG. 4, when the multi-mode optical field is in a second-order mode, there are two heavily germanium-doped region on the interior top of the multi-mode germanium absorption waveguide, two third through-holes are present between the germanium electrode and the heavily germanium-doped region, the optical field distribution of the multi-mode optical field is three circular optical spots, each circular optical spot has the strongest light intensity at its center, and the light intensity gradually attenuates from the center towards the periphery, the two heavily germanium-doped region are respectively located at edges where every two outer contour lines of the three circular optical spots come into contact and are relatively far from the centers of the three circular optical spots, the positions covered with the two heavily germanium-doped region both have a very weak light intensity, as a result, the absorption loss brought on the optical field by the two heavily germanium-doped region and the two third through-holes is dramatically reduced and the responsiveness of the silicon-germanium photoelectric detection apparatus can be improved effectively.

Various modifications and variations could be made to the embodiments of the invention by those skilled in the art. These modifications and variations also fall into the scope of the invention if included within the scope of the claims of the invention and its equivalents.

The content that is not detailed in the description is the prior art known to those skilled in the art.

The invention claimed is:

1. A silicon-germanium photoelectric detection apparatus based on on-chip mode converter, comprises an insulating substrate, an optical coupler, an on-chip mode converter and a multi-mode silicon-germanium photoelectric detector, the optical coupler, the on-chip mode converter and the multi-mode silicon-germanium photoelectric detector are sequentially connected and all fixed on silicon wafers of the insulating substrate, a fundamental mode optical signal is transmitted to the optical coupler through a single-mode fiber, the fundamental mode optical signal coupled via the optical coupler enters the on-chip mode converter, the on-chip mode converter converts the fundamental mode optical signal into a multi-mode optical field, and the multi-mode optical field enters the multi-mode silicon-germanium photoelectric detector, which then converts the multi-mode optical field into an electrical signal;

wherein the multi-mode silicon-germanium photoelectric detector comprises a silicon substrate layer, the silicon substrate layer is covered with a silicon dioxide layer over which a first heavily silicon-doped region, a lightly silicon-doped region and a second heavily silicon-doped region are distributed, the first heavily silicon-doped region and the second heavily silicon-doped region are located on both sides of the lightly silicon-doped region, respectively, a multi-mode germanium absorption waveguide is grown on the lightly silicon-doped region, at least one heavily germanium-doped region is on the interior top of the multi-mode germanium absorption waveguide, the periphery of the multi-mode germanium absorption waveguide is covered with the silicon dioxide layer, a first silicon electrode, a germanium electrode and a second silicon electrode are disposed on the silicon dioxide layer, the first silicon electrode is located immediately above the first heavily silicon-doped region, the second silicon electrode is located immediately above the second heavily silicon-doped region, the germanium electrode is located immediately above the heavily germanium-doped region, a first through-hole is formed on the silicon dioxide layer between the first silicon electrode and the first heavily silicon-doped region, at least one third through-hole is formed on the silicon dioxide layer between the germanium electrode and at least one heavily germanium-doped region, the third through-holes are in one-to-one correspondence with the heavily germanium-doped region, a second through-hole is formed on the silicon dioxide layer between the second silicon electrode and the second heavily silicon-doped region, the first through-hole, the third through-holes and the second through-hole are each internally filled with metal that functions as a conductor, the first silicon electrode accomplishes electrical connection with the first heavily silicon-doped region through the metal conductor within the first through-hole, the germanium electrode accomplishes electrical connection with the heavily germanium-doped region through the metal conductors within the third through-holes, and the second silicon electrode accomplishes electrical connection with the second heavily silicon-doped region through the metal conductor within the second through-hole.

2. The photoelectric detection apparatus according to claim 1, wherein the multi-mode optical field generated by the multi-mode germanium absorption waveguide is composed of a plurality of transversely-distributed circular optical spots with each having the strongest light intensity at its center, the light intensity gradually attenuates from the center towards the periphery, and the heavily germanium-doped region are located in areas with relatively weak distributed light intensity of the multi-mode optical field.

3. The photoelectric detection apparatus according to claim 2, wherein the positions covered with the heavily germanium-doped region have a light intensity that is 15% smaller than the position with the strongest light intensity in the multi-mode optical field.

4. The photoelectric detection apparatus according to claim 2, wherein when the multi-mode optical field is in a first-order mode, there is only one heavily germanium-doped region on the interior top of the multi-mode germanium absorption waveguide, only one third through-hole is present between the germanium electrode and the heavily germanium-doped region, the multi-mode optical field has an optical field distribution of two circular optical spots, each circular optical spot has the strongest light intensity at its center, and the light intensity gradually attenuates from the center towards the periphery, the heavily germanium-doped region is located at an edge where outer contour lines of the two circular optical spots come into contact and is relatively far from the centers of the two circular optical spots, the position covered with the heavily germanium-doped region has a very weak light intensity, the absorption loss brought on the optical field by the heavily germanium-doped region and the third through-hole is dramatically reduced and the responsiveness of the silicon-germanium photoelectric detection apparatus can be improved effectively.

5. The photoelectric detection apparatus according to claim 2, wherein when the multi-mode optical field is in a second-order mode, there are two heavily germanium-doped region on the interior top of the multi-mode germanium absorption waveguide, two third through-holes are present between the germanium electrode and the heavily germanium-doped region, the optical field distribution of the multi-mode optical field is formed by three circular optical spots, each circular optical spot has the strongest light intensity at its center, and the light intensity gradually attenuates from the center towards the periphery, the two heavily germanium-doped region are respectively located at edges where every two outer contour lines of the three circular optical spots come into contact and are relatively far from the centers of the three circular optical spots, the positions covered with the two heavily germanium-doped region both have a very weak light intensity, the absorption loss brought on the optical field by the two heavily germanium-doped region and the two third through-holes is dramatically reduced and the responsiveness of the silicon-germanium photoelectric detection apparatus can be improved effectively.

* * * * *